United States Patent [19]
Cho et al.

[11] Patent Number: 5,741,739
[45] Date of Patent: Apr. 21, 1998

[54] MANUFACTURING METHOD OF A CHARGE STORAGE ELECTRODE BY USING CYLINDRICAL OXIDE PATTERNS

[75] Inventors: Sung Chun Cho, Suwon; Kyung Dong Yoo, Seoul, both of Rep. of Korea

[73] Assignee: Hyundai Electronics Industries Co., Ltd., Kyungki-Do, Rep. of Korea

[21] Appl. No.: 723,582

[22] Filed: Oct. 1, 1996

Related U.S. Application Data

[62] Division of Ser. No. 363,902, Dec. 27, 1994, Pat. No. 5,561,309.

[30] Foreign Application Priority Data

Dec. 27, 1993 [KR] Rep. of Korea .............. 93 29781

[51] Int. Cl.⁶ .................................................. H01L 21/8242
[52] U.S. Cl. ........................................... 438/387; 438/666
[58] Field of Search ................................. 438/243, 244, 438/386, 387, 639, 666, 702

[56] References Cited

U.S. PATENT DOCUMENTS

| | | | |
|---|---|---|---|
| 4,859,615 | 8/1989 | Tsukamoto et al. | 438/387 |
| 5,238,862 | 8/1993 | Black et al. | 438/398 |
| 5,374,580 | 12/1994 | Baglee et al. | 438/386 |
| 5,427,972 | 6/1995 | Shimizu et al. | 438/666 |

*Primary Examiner*—Chandra Chaudhari
*Attorney, Agent, or Firm*—Fish & Richardson P.C.

[57] ABSTRACT

The present invention disclosed a structure of a charge storage electrode the and manufacturing method therefor. The present invention features forming initial oxide pattern (s) having viscous property at certain temperatures on a barrier layer as rectangular bar-shaped pattern(s) and applying heat to the oxide pattern(s) to transform the initial oxide pattern(s) to cylindrical oxide pattern(s); depositing polysilicon layer on the cylindrical oxide pattern(s); etching each end of the portions of the polysilicon layer and removing the oxide pattern(s); so as to provide a charge storage electrode structure having at least one conduit(s) which is formed with a polysilicon. The charge storage electrode structure according to the present invention has an increased effective surface area and is manufactured by a relatively simple method facilitating the manufacture of highly integrated semiconductor device.

17 Claims, 2 Drawing Sheets

5,741,739

MANUFACTURING METHOD OF A CHARGE STORAGE ELECTRODE BY USING CYLINDRICAL OXIDE PATTERNS

This is a divisional of application Ser. No. 08/363,902 filed on Dec. 27, 1994, now U.S. Pat. No. 5,561,309.

FIELD OF THE INVENTION

The present invention relates to the structure and manufacturing method of a charge storage electrode, and more particularly to the structure and manufacturing method of a charge storage electrode which can increase the capacitance in a limited area by forming a plurality of conduits formed with an oxide having a viscous flow property.

INFORMATION DISCLOSURE STATEMENT

Generally, as a semiconductor device becomes more integrated, the unit cell area decreases. However, a minimum capacitance is needed to operate the device notwithstanding the reduction in the unit cell area.

A variety of charge storage electrodes having a three dimensional structure can solve this capacitance problem. However, since these three dimensional charge storage electrodes are difficult to manufacture, much effort has been made to simplify the manufacturing processes for manufacturing the electrodes.

SUMMARY OF THE INVENTION

An object of the invention is to provide a charge storage electrode structure which increases capacitance in a limited area and a simplified manufacturing method.

In order to achieve these objects, the present invention provides a charge storage electrode structure having at least one conduit(s) which is formed with a conductivity material.

Further, the present invention provides a manufacturing method of the charge storage electrode, comprising the steps of:

forming an insulating layer on a silicon substrate on which a junction region is formed;

forming an etching barrier layer on the insulating layer;

forming at least one initial oxide pattern(s) on the etching barrier layer;

transforming a shape of the initial oxide pattern(s) by a heat treatment process, thereby forming transformed oxide pattern(s);

forming a contact hole on the junction region by etching a portion of the etching barrier layer and the insulating layer using a charge storage electrode contact mask;

forming a polysilicon layer on the surfaces of the contact hole, the etching barrier layer and the transformed pattern(s);

etching the exposed portions of the polysilicon layer by an etching process using a charge storage electrode mask, thereby exposing a portion at both ends of the transformed oxide pattern(s);

removing the cylindrical oxide pattern(s) by a wet etching process, thereby forming through hole(s); and etching exposed portions of said etching barrier layer to form a charge storage electrode having at least one conduit.

BRIEF DESCRIPTION OF THE DRAWINGS

For a full understanding of the nature and objects of the invention, reference should be had to the following detailed description taken in conjunction with the accompanying drawings in which.

DETAILED DESCRIPTION OF THE INVENTION

Figure 1A:
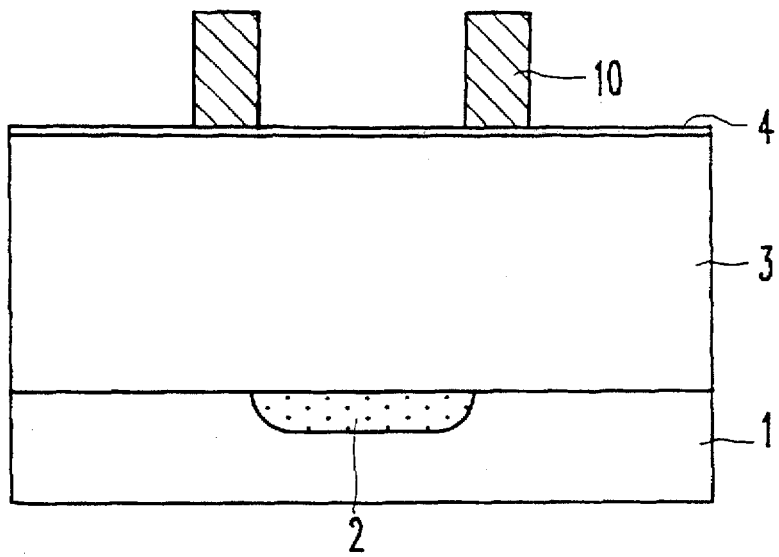
FIGS. 1A to 1F are cross-sectional views illustrating the processes for manufacturing a charge storage electrode of a capacitor according to the present invention.

Referring to FIG. 1A, a junction region 2 is formed on a silicon substrate 1 by an impurity ion implantation process. An insulating layer 3 is formed on the silicon substrate 1 including the junction region 2. An etching barrier layer 4 is formed on the insulating layer 3, and two of initial oxide patterns 10 are formed on the etching barrier layer 4. The insulating layer 3 is formed with BPSG(Boron Phosphorous Silicate Glass) having a viscous flow property in order to obtain a flat surface.

The etching barrier layer 4 is formed with a polysilicon or nitride with an etching ratio different from the initial oxide patterns 10, so that when the initial oxide patterns 10 are formed, the removal of the insulating layer 3 from the etching can be avoided.

An oxide having a viscous flow property, such a BPSG, $O_3$-BPSG, BSG(Boron silicate Glass) or PSG(Phosphorous Silicate Glass) is thickly deposited on the etching barrier layer 4, thereafter the initial oxide patterns 10 are formed by etching the oxide with an anisotropic etching process. The length of the initial oxide patterns 10 is longer than the width of the charge storage electrode region and the initial oxide patterns 10 are in form of rectangular bar-shaped. With reference to FIG. 1A, the initial patterns 10 are formed parallel to each other on the etching barrier 4. Although two oxide patterns 10 are formed as illustrated in FIG. 1A, the present invention does not limit the number of patterns, and one or more initial oxide pattern(s) 10 may be formed in an orderly or disorderly position relative to each other.

Figure 1B:
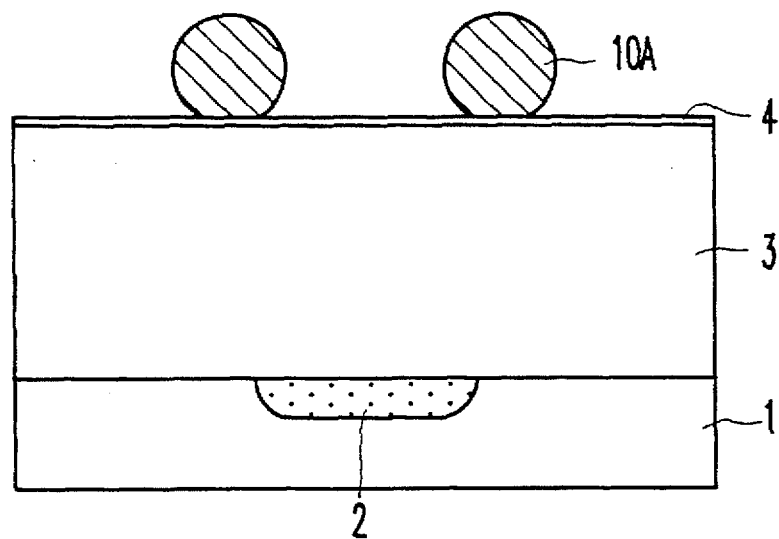

Referring to FIG. 1B, the initial oxide patterns 10 are transformed by a heat treatment, therfore transformed oxide patterns are formed.

Since the initial oxide patterns 10 have a viscous flow property, the oxide of the initial oxide patterns 10 is flowed by a heat treatment at temperatures of 750 to 950 degree Celsius, therefore the rectangular bar-shaped oxide patterns 10 are transformed into cylindrical oxide patterns 10A which both ends have a curved shape.

Figure 1C:
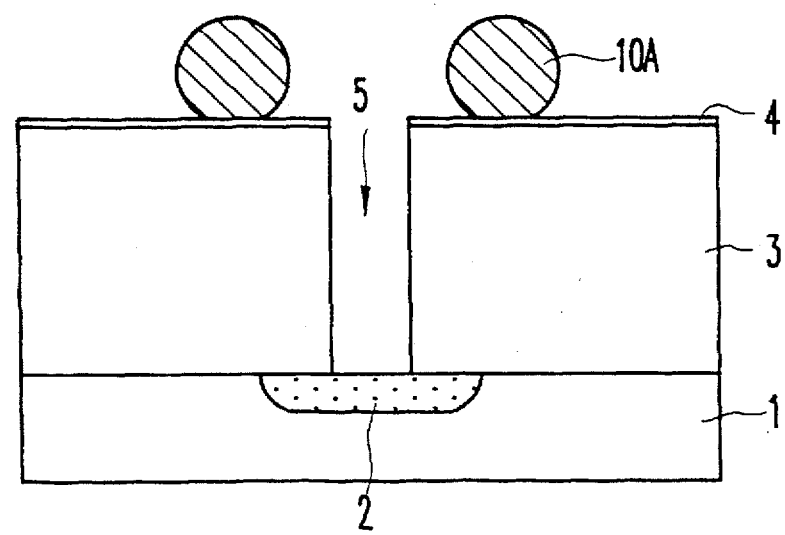

The shape of transformed oxide patterns 10A is determined by the thickness and width of the initial oxide patterns 10. The resulting shape of the oxide patterns 10A depends on the ratio of the height to the width of the rectangular oxide(initial) patterns 10. The circle-shaped cross-section as shown in FIG. 1B is a result of a height-width ratio of 3:2. If the ratio differ from the 3:2 ratio, an elliptical cross-section is obtained. Therefore, any desired cross-section can be obtained by changing the height-width ratio of the initial oxide patterns Referring to FIG. 1C, the etching barrier layer 4 and the insulating layer 3 are etched by an anisotropic etching process using a charge storage electrode contact mask so that a part of the junction region 2 is exposed, thereby forming a contact hole 5.

Figure 1D:
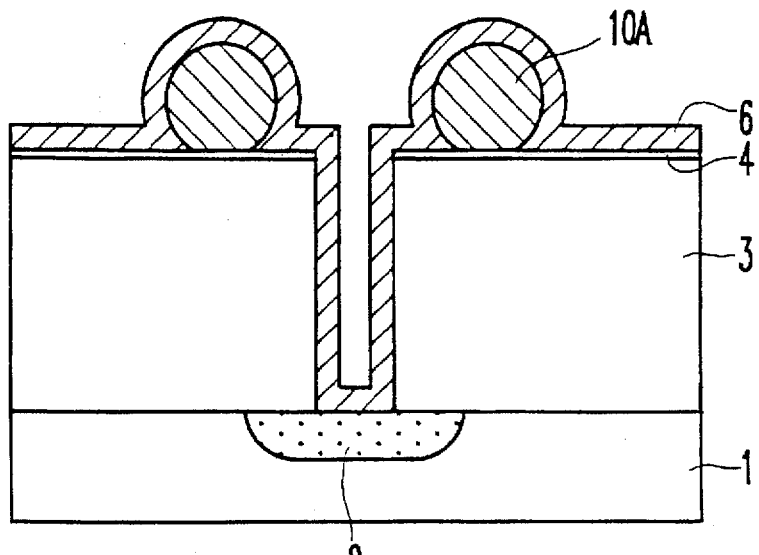

Referring to FIG. 1D, a polysilicon layer 6 is formed on the entire structure constituting the contact hole 5, the transformed oxide patterns 10A and the etching barrier layer 4. In order to prevent a reflowing of the transformed oxide patterns 10A during the polysilicon deposit process, the deposit process should be executed at temperatures lower than the temperature at which oxide patterns flow; therefore, the polysilicon layer 6 should be deposited with in-situ phosphorous doped polysilicon at the temperature of 500 to 600 degree Celsius.

Figure 1E:
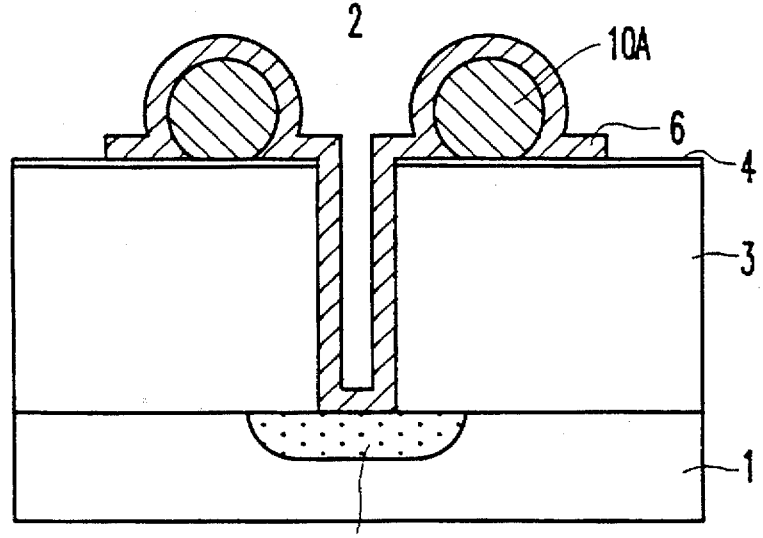

Referring to FIG. 1E, the portions of the polysilicon layer 6 are etched by an anisotropic etching process using a charge storage electrode mask. The anisotropic etching process is executed until the etching barrier layer 4 is exposed. At this time, a portion at both ends of the transformed oxide patterns 10A is exposed. It is important to etch only the polysilicon layer 6 without damaging the insulating layer 4.

Figure 1F:
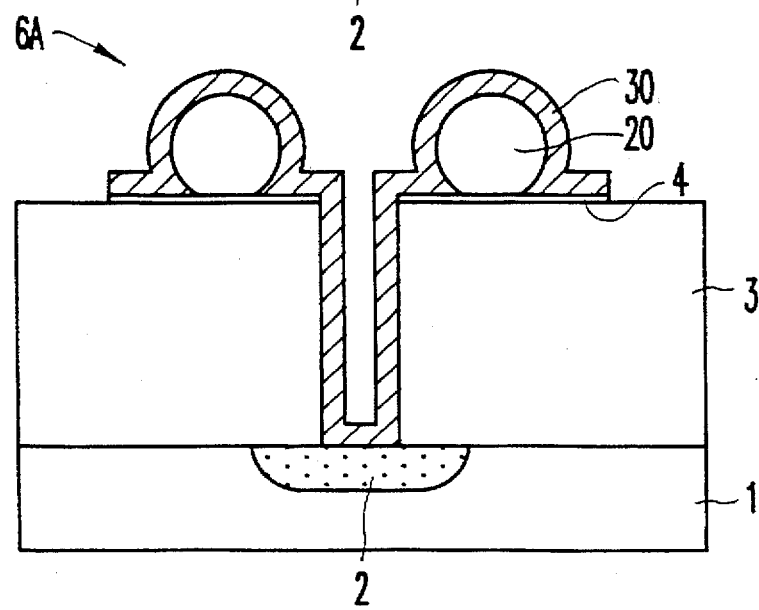

Referring to FIG. 1F, the transformed oxide patterns 10A are removed by a wet etching process, thereby through holes 20 at place of the patterns 10A. The exposed portion of the etching barrier layer 4 is etched by an anisotropic etching process, therefore a charge storage electrode 6A having conduits 30 is formed.

The resulting charge storage electrode 6A according to the present invention has a structure with at least one conduit(s) 30 on the surface, such that the inner walls of the conduit(s) 30 and the uneven surfaces of the charge storage electrode 6A increase the effective surface within the limited area.

The present invention, as described above, provides for a charge storage electrode having at least one conduit(s) on the surface to increase the effective surface area by means of a relatively simple method for ease in manufacturing integrated semiconductor device.

Although this invention has been described in its preferred form with a certain degree of particularity, it is appreciated by those skilled in the art that the present disclosure of the preferred form has been made only as an example and that numerous changes in the detailed of the construction, combination and arrangement of is parts may be resorted to without departing from the spirit and scope of the invention.

What is claimed is:

1. A method for manufacturing a charge storage electrode for a capacitor, comprising the steps of:

forming an insulating layer on a silicon substrate on which a junction region is formed;

forming an etching barrier layer on said insulating layer;

forming at least one initial oxide pattern(s) on said etching barrier layer;

transforming said initial oxide pattern(s) by a heat treatment process, thereby forming a transformed oxide pattern(s);

forming a contact hole on said junction region by etching said etching barrier layer and said insulating layer using a charge storage electrode contact mask;

forming a polysilicon layer on the surfaces of said contact hole, said etching barrier layer and said transformed oxide pattern(s);

etching the exposed portions of said polysilicon layer by an etching process using a charge storage electrode mask, thereby exposing a portion at both ends of said transformed oxide pattern(s);

removing said transformed oxide pattern(s) by a wet etching process, thereby forming a through hole(s); and etching exposed portions of said etching barrier layer to form a charge storage electrode having at least one conduit(s).

2. The method of claim 1, wherein said insulating layer is formed with BPSG.

3. The method of claim 1, wherein said etching barrier layer is composed of materials having an etching ratio different from that of said initial oxide pattern(s).

4. The method of claim 1 or 3, wherein said etching barrier layer is formed with polysilicon.

5. The method of claim 1 or 3, wherein said etching barrier layer is formed with nitride.

6. The method of claim 1, wherein said initial oxide pattern(s) is formed with an oxide having a viscous flow property.

7. The method of claim 6, wherein said oxide is BPSG.

8. The method of claim 6, wherein said oxide is $O_3$-BPSG.

9. The method of claim 6, wherein said oxide is BSG.

10. The method of claim 6, wherein said oxide is PSG.

11. The method of claim 1, wherein the length of said initial oxide pattern(s) is longer than the width of said charge storage electrode.

12. The method of claim 1, wherein said initial oxide patterns are formed parallel to each other on said etching barrier layer.

13. The method of claim 1, wherein said initial oxide pattern(s) are formed orderly manner on said etching barrier layer.

14. The method of claim 1, wherein said initial oxide patterns are formed disorderly manner on said etching barrier layer.

15. The method of claim 1, wherein said heat treatment process is executed at temperatures of 750 to 950 degree Celsius.

16. The method of claim 1, wherein the shape of said transformed oxide pattern(s) is determined according to the height-width ratio of said initial oxide pattern(s).

17. The method of claim 1, wherein said polysilicon layer is formed with in-situ phosphorous doped polysilicon at the temperatures of 500 to 600 degree Celsius.

* * * * *